United States Patent
Krone et al.

(10) Patent No.: US 10,983,443 B2
(45) Date of Patent: Apr. 20, 2021

(54) CONTROL DEVICE FOR ACTUATING AN ACTUATOR UNIT OF A LITHOGRAPHY SYSTEM, LITHOGRAPHY SYSTEM HAVING A CONTROL DEVICE, AND METHOD FOR OPERATING THE CONTROL DEVICE

(71) Applicant: Carl Zeiss SMT GmbH, Oberkochen (DE)

(72) Inventors: Stefan Krone, Aalen (DE); Lars Berger, Aalen-Unterkochen (DE); Ralf Kiesel, Aalen-Unterkochen (DE); Paul Wijlaars, Someren (NL)

(73) Assignee: Carl Zeiss SMT GmbH, Oberkochen (DE)

( * ) Notice: Subject to any disclaimer, the term of this patent is extended or adjusted under 35 U.S.C. 154(b) by 42 days.

(21) Appl. No.: 16/447,622

(22) Filed: Jun. 20, 2019

(65) Prior Publication Data
US 2019/0302626 A1 Oct. 3, 2019

Related U.S. Application Data

(63) Continuation of application No. PCT/EP2017/083569, filed on Dec. 19, 2017.

(30) Foreign Application Priority Data

Dec. 22, 2016 (DE) .......................... 102016226082.0

(51) Int. Cl.
*G03F 7/20* (2006.01)
*G02B 7/182* (2021.01)
(Continued)

(52) U.S. Cl.
CPC ....... *G03F 7/70258* (2013.01); *G02B 7/1828* (2013.01); *G03F 7/70575* (2013.01);
(Continued)

(58) Field of Classification Search
CPC .............. G03F 7/0258; G03F 7/70575; G03F 7/70891; G03F 7/7033; G02B 7/1828;
(Continued)

(56) References Cited

U.S. PATENT DOCUMENTS 7,843,242 B1 * 11/2010 Zhao .................... G06F 1/025
327/175
10,158,347 B2 12/2018 Rosenberger et al.

FOREIGN PATENT DOCUMENTS

DE         196 30 036 A1    1/1998
DE   10 2005 062 081 A1    7/2007
(Continued)

OTHER PUBLICATIONS

International Search Report for corresponding PCT Appl No. PCT/EP2017/083569, dated Apr. 6, 2018.

*Primary Examiner* — Arnold M Kinkead
(74) *Attorney, Agent, or Firm* — Fish & Richardson P.C.

(57) ABSTRACT

A control device actuates actuator unit to set a position of an optical element of a lithography system. The control device includes an amplifier unit for providing a control signal for the actuator unit via a voltage signal and a PWM signal. The PWM signal has a duty factor and a clock frequency. The control device also includes a modulator unit designed to provide the PWM signal having the duty factor and a defined clock frequency from a plurality of defined clock frequencies. A defined clock frequency of the plurality of defined clock frequencies is an integer multiple of a basic clock frequency. The basic clock frequency is in the range of 10 kHz to 1 MHz.

20 Claims, 11 Drawing Sheets

(51) Int. Cl.
    *H03K 7/08*         (2006.01)
    *H01L 41/04*       (2006.01)
    *H03K 3/017*      (2006.01)
    *H01L 41/09*       (2006.01)

(52) U.S. Cl.
    CPC .......... *G03F 7/70891* (2013.01); *H01L 41/04* (2013.01); *H01L 41/042* (2013.01); *H01L 41/09* (2013.01); *H03K 3/017* (2013.01); *H03K 7/08* (2013.01)

(58) Field of Classification Search
    CPC .......... H03K 7/08; H03K 3/017; H01L 41/04; H01L 41/09; H01L 41/042
    USPC ....... 430/321, 327; 250/504 R, 492.2, 494.1; 355/30, 18, 39, 44, 67; 307/10.1, 9.1, 307/104; 327/175, 172
    See application file for complete search history.

(56) References Cited

FOREIGN PATENT DOCUMENTS

| | | |
|---|---|---|
| DE | 10 2007 023 388 A1 | 1/2008 |
| DE | 10 2011 087 910 A1 | 2/2013 |
| DE | 10 2014 218 010 A1 | 3/2016 |
| EP | 2 687 906 A2 | 1/2014 |
| JP | 2002374695 A * | 12/2002 |

\* cited by examiner

CONTROL DEVICE FOR ACTUATING AN ACTUATOR UNIT OF A LITHOGRAPHY SYSTEM, LITHOGRAPHY SYSTEM HAVING A CONTROL DEVICE, AND METHOD FOR OPERATING THE CONTROL DEVICE

CROSS-REFERENCE TO RELATED APPLICATIONS

The present application is a continuation of, and claims benefit under 35 USC 120 to, international application PCT/EP2017/083569, filed Dec. 19, 2017, which claims benefit under 35 USC 119 of German Application No. 10 2016 226 082.0, filed Dec. 22, 2016. The entire disclosure of these applications are incorporated by reference herein.

FIELD

The present disclosure relates to a control device for actuating an actuator unit of a lithography apparatus, to a lithography apparatus including such a control device, and to a method for operating such a control device.

BACKGROUND

By way of example, lithography apparatuses are used in the production of integrated circuits or ICs for imaging a mask pattern in a mask onto a substrate such as e.g. a silicon wafer. In so doing, a light beam generated by an optical system is directed through the mask onto the substrate.

In this case, the representable feature size depends greatly on the light wavelength used. In order to attain particularly small structures, it is desirable to use radiation of particularly short wavelength. EUV lithography apparatuses use light having a wavelength in the range of 5 nm to 30 nm, in particular 13.5 nm. "EUV" denotes "extreme ultraviolet". In the case of such lithography apparatuses, owing to the high absorption of light of this wavelength by most materials, reflective optical units, that is to say mirrors, have to be used instead of refractive optical units, that is to say lens elements. Moreover, the housing in which the imaging optical unit is situated has to be evacuated since even the presence of a gas can result in great absorption of the radiation.

The smaller the feature size striven for, the better the resolution of the imaging optical unit should be. In this case, there are many variable influences that can impair the resolution, for example oscillations, vibrations and/or thermal effects which affect optical properties of optical elements. Such variable influences can be at least partly compensated for using suitable measures. Wavefront manipulators are known, for example, which can correct imaging aberrations via a targeted displacement of optical elements. The displacement is effected in particular via an actuator assigned to the respective optical element.

For actuating optical elements in lithography apparatuses, switching amplifiers are often used since the latter have a lower power loss by comparison with linear amplifiers, for example, which overall offers positive effects on the system design, in particular with regard to the electrical power supplied and the heat to be dissipated. Switching amplifiers are electronic components that generate an output signal, for example a control voltage for an actuator, from two input signals. The input signals are, for example, a PWM signal (PWM: pulse width modulation) and a constant voltage signal. The PWM signal is a piecewise periodic signal having two levels per period, such as, for example, on/off, −0.5/+0.5 or 0/1, which signal has a duty ratio. The value of the duty ratio corresponds to the duration of the first level in relation to the duration of a total period. The inverse of the total period is referred to as the clock frequency of the PWM signal. The output signal corresponds approximately to the product of the constant voltage signal and the PWM signal. Such a rectangular output signal has a mean value over time that scales approximately linearly with the duty ratio of the PWM signal. If this output signal is used as a control signal for an actuator whose frequency bandwidth is smaller than the clock frequency of the PWM signal, then the actuator behaves as if it were actuated by a DC voltage signal corresponding to the mean value of the rectangular output signal of the switching amplifier. Different mean values of the output signal can therefore be obtained by varying the duty ratio.

However, switching amplifiers can, for example, involve a ripple current in the supply line, a ripple voltage at the output, a power loss dependent on clock frequency and duty ratio, a limited bandwidth of the settable duty ratios and a limited bandwidth of the possible clock frequencies. A ripple current is also referred to as ripple of the current. The ripple current can also occur within the switching amplifier, which can have a disadvantageous effect on operation.

SUMMARY

The present disclosure seeks to provide an improved control device for actuating an actuator in lithography apparatuses.

Accordingly, a control device for actuating an actuator unit for setting a position of an optical element of a lithography apparatus is proposed. The control device includes an amplifier unit for providing a control signal for the actuator unit via a voltage signal and a PWM signal. The PWM signal has a duty ratio and a clock frequency. Furthermore, the control device includes a modulator unit configured to provide the PWM signal having the duty ratio with a defined clock frequency from a plurality of defined clock frequencies.

Such a control device has the advantage that each duty ratio is able to be provided with a defined clock frequency, wherein the defined clock frequency is selected from a prescribed plurality of clock frequencies. It is thus possible to realize advantageous combinations of duty ratio and clock frequency if a single clock frequency for all duty ratios is suboptimal on account of different requirements. By way of example, a power loss of the amplifier unit for a given duty ratio may be different for different clock frequencies. An optimum clock frequency having an advantageous power loss can then be selected from the plurality of clock frequencies. Furthermore, since a limited number of predetermined defined clock frequencies are available, the behavior of such a control device can be predicted well and possible cross-influencing with other electrical components of the lithography apparatus can be monitored.

The control device is preferably embodied as an electronic circuit, for example as an integrated circuit. In this case, the control device has various analog and/or digital components and/or assemblies. By way of example, the control device has a capacitor, a coil, a voltage source, a transistor, in particular a MOSFET (Metal oxide semiconductor field-effect transistor), a diode, and/or further components of this type. The control device overall can also be referred to as a switching amplifier.

An actuator unit is for example, an electromechanical actuator such as, in particular, a Lorentz actuator, an inductive actuator and/or a capacitive actuator. The actuator unit is arranged, for example, at an optical element of the lithography apparatus. By virtue of the fact that the actuator unit is actuated with a control signal the position of the optical element assigned to the actuator unit is thus variable. The control signal can be a DC voltage signal, for example. Depending on a level of the DC voltage signal, the actuator unit changes the position. The DC voltage signal is generated via an amplified PWM signal since the actuator unit is sluggish in comparison with the clock frequency of the PWM signal.

An optical element of the lithography apparatus is, in particular, a lens element and/or a mirror. Using a relative displacement of an optical element relative to, for example, an image plane and/or a field plane and/or to further optical elements, it is possible to adapt different beam properties of an exposure light beam of the lithography apparatus. By way of example, a wavefront of the exposure light beam can be altered and image aberrations can thus be corrected.

The amplifier unit has two signal inputs and one signal output, for example. An amplified input signal is provided as an output signal at the signal output. The output signal corresponds to the control signal for the actuator unit. By way of example, one signal input is occupied by a DC voltage having a constant voltage value, and the other signal input is occupied by the input signal to be amplified. The DC voltage can also be referred to as supply voltage or operating voltage. The amplifier unit provides the output signal for example via a multiplication of the input signal by the DC voltage. It can also be stated that the amplifier unit provides the output signal by forming the product of the two input signals. In the present case, providing can also be referred to as generating and/or producing.

The input signal is, in particular, a PWM signal (PWM: Pulse width modulation). PWM denotes a possibility for using a signal having exactly two levels to provide a signal having a mean value lying between the two levels. By way of example, they are the levels 0 and 1. Any signal having a mean value in the range of 0 to 1 can then be represented via the PWM. Other values are also possible. If the two levels are −10 V and +10 V, for example, a signal whose mean value is in the range of −10 V to +10 V can be represented via PWM. The mean value of the PWM signal can be calculated approximately in accordance with equation 1:

$$P1 \cdot \tau + P2 \cdot (1-\tau) = Pm \quad \text{(Equation 1)}$$

In this case, P1 denotes the first level, P2 denotes the second level, Pm denotes the mean value and τ denotes the duty ratio. In the case of PWM this is achieved by the pulse duration of an individual pulse being adapted for a prescribed clock frequency. The term pulse denotes those time intervals in a signal which have the level value 1. For a clock frequency of 1 Hz, it is thus possible to obtain a duty ratio of 0.5 by generating a pulse having a duration of 0.5 s. That is to say that the signal has the level 1 for 0.5 s and the level 0 for a further 0.5 s. If a PWM signal having this duty ratio is intended to be present for 10 s, then a total of 10 of these pulses having a duration of 0.5 s and a temporal separation of 0.5 s would be generated. A prescribed duty ratio can be realized with different clock frequencies. The clock frequency indicates, in particular, in what temporal sequence the individual pulses are generated. The reciprocal of the clock frequency is the period duration. If the clock frequency in the example mentioned above is 100 Hz, for example, then the period duration is 1/100 s. In order to obtain a duty ratio of 0.5, the pulse duration should then be set to 1/200 s. If the clock frequency and the pulse duration of a signal are known, the duty ratio of the signal can be determined from the ratio of pulse duration to period duration. In the example mentioned, the duty ratio would therefore be (1/200)/(1/100)=0.5.

The clock frequency limits the temporal resolution with which the duty ratio of the PWM signal is variable. For a clock frequency of 1 Hz, it is possible to establish the duty ratio in each case for one second by adapting the pulse duration. For a clock frequency of 100 Hz, it is possible to establish the duty ratio for every 1/100 s.

The control signal provided by the amplifier unit via the PWM signal and the constant voltage signal has, in particular, the same signal waveform as the PWM signal, wherein the levels correspond to the product of the PWM signal levels and the constant voltage signal. Consequently, the control signal can also be regarded as a PWM signal.

Clock frequencies of from a few kHz to MHz are advantageously used. This also ensures, in particular, that the actuator unit "sees" the mean value of the control signal. This means that the actuator unit itself reacts as to a low-pass-filtered PWM signal. This is owing to the inertia of the actuator unit, for example, which cannot follow a movement at such a high frequency. The actuator unit is configured, for example, to bring about a displacement of an optical element from a zero position by up to one centimeter in one direction. By way of example, an amplitude of the deflection from the zero position is linearly dependent on a level of the control signal. In this case, a maximum amplitude or maximum deflection is achieved for a maximum level corresponding to the value of the DC voltage signal. In order to deflect the optical element for example by 0.4 cm from the zero position, a control signal having a level corresponding to 0.4 times the maximum level is used. This is achieved in particular via a PWM signal having a duty ratio of 0.4, which is amplified with the DC voltage signal.

The modulator unit is configured to provide the PWM signal having the duty ratio. In this case, the modulator unit is advantageously configured to generate the duty ratio with a defined clock frequency, wherein the defined clock frequency is selected from a plurality of different defined clock frequencies.

By way of example, a duty ratio of 0.4 is used. The modulator unit is then configured to generate this duty ratio for example with a clock frequency of 10 kHz. The period duration is then 100 μs. The level 1 is output for 40 μs and the level 0 is output for a further 60 μs. Alternatively, the modulator unit can also generate the duty ratio with a clock frequency of 1 MHz, wherein the period duration is 1 μs. For this purpose, the level 1 is then output for 0.4 μs and the level 0 is output for 0.6 μs. In order to attain the same signal length as in that case, this is repeated 100 times.

Depending on application-specific boundary conditions, it may be advantageous to generate a first duty ratio with a first clock frequency and to generate a second duty ratio with a second clock frequency. By way of example, switching amplifiers have a power loss that rises greatly for a given clock frequency with respect to low and/or high duty ratios in comparison with average duty ratios. This rise is smaller for low clock frequencies, for which reason a lower clock frequency is preferred with regard to the power loss. However, such a switching amplifier may have a ripple voltage at its output, for example, the amplitude of which voltage is very high for average duty ratios and a low clock frequency, which can have adverse effects on the actuator unit. A ripple voltage is an AC voltage superposed on the DC voltage signal. There may likewise be a ripple current constituting an AC current signal superposed on a current signal corresponding to the DC voltage signal. Such ripple currents and/or ripple voltages may also be referred to as ripple of a respective signal. Furthermore, such ripple may also occur in the switching amplifier itself. If a switching amplifier is operated with a single clock frequency in a conventional manner, then losses either in terms of efficiency or in terms of signal quality inevitably arise. Such a problem is solved according to the disclosure by the use of one defined clock frequency for a duty ratio from a plurality of defined clock frequencies for generating the PWM signal.

In contrast to a conventional delta-sigma modulation, the PWM signal generated according to the disclosure has a well-defined clock frequency at any time. In particular, a limited number of discrete clock frequencies are provided. This has the advantage, in particular, that each of the defined clock frequencies can be checked for compatibility with further electrical components of the lithography apparatus. It is thus possible to ensure that cross-influencing and/or a disturbance of different components are/is precluded. By way of example, it is possible for certain clock frequencies and/or intervals of clock frequencies to result in a resonance and/or an emission of electromagnetic fields. Advantageously, none of the defined clock frequencies of the plurality originates from such an interval.

In accordance with one embodiment of the control device, the amplifier unit is configured to provide the control signal for the actuator unit in a first time interval using a first PWM signal having a first defined clock frequency from the plurality of defined clock frequencies and in a second time interval, directly following the first time interval, using a second PWM signal having a second defined clock frequency from the plurality of defined clock frequencies without interruption.

This embodiment has the advantage, in particular, that the control signal can be provided at any time with a PWM signal optimized for a respective operating situation, without the control signal being interrupted in the event of the PWM signal being changed, for example in order to generate a new duty ratio with a changed clock frequency. It can also be stated that the PWM signal for providing the control signal is adaptively adapted.

The first PWM signal and the second PWM signal have, in particular, different defined clock frequencies. Furthermore, they may also differ in their duty ratio.

In the present case, providing without interruption is understood to mean that the control signal is available at the actuator at any point in time of the first time interval and at any point in time of the second time interval. In particular, this precludes for example the modulator unit and/or the amplifier unit being momentarily switched off or the signal connections being momentarily interrupted in order to provide the new control signal.

In accordance with a further embodiment of the control device, the modulator unit is configured, depending on a position to be set of the optical element, to provide the PWM signal having a current duty ratio. Furthermore, the modulator unit is configured to select the defined clock frequency of the PWM signal from the plurality of defined clock frequencies depending on the current duty ratio.

The duty ratio is substantially defined by the position to be set of the optical element. The position to be set can be acquired for example using a user input, using a computer-aided sequence and/or a control loop. From the position to be set it is possible to derive, in particular, the duty ratio for aligning the actuator unit with the position. Advantageously, the modulator unit is configured, depending on the current duty ratio, to select a defined clock frequency for providing the current duty ratio from the plurality of defined duty ratios. This can be done for example via a prescribed assignment of defined clock frequencies to settable duty ratios.

By way of example, a position is requested which is to be set with a duty ratio of 0.5. The modulator unit then selects for example a defined clock frequency which is a high clock frequency in comparison with the further defined clock frequencies, since for example the ripple current, the ripple voltage and also the power loss can thereby be kept low simultaneously. If a position is subsequently requested which is to be set with a duty ratio of 0.9, for the purpose of setting this duty ratio the modulator unit selects for example a defined clock frequency which is a low clock frequency in comparison with the further defined clock frequencies, since, as before, for example the ripple current, the ripple voltage and the power loss can thereby be kept low. This has the advantage over a constant clock frequency for each duty ratio that a simultaneous optimization of ripple current, ripple voltage, power loss and/or further system parameters is possible.

In accordance with a further embodiment of the control device, the plurality of defined clock frequencies includes at most ten different defined clock frequencies.

A larger number of defined clock frequencies is indeed possible. However, with the number of defined clock frequencies, the outlay for implementation increases and an advantage from a greater diversity of defined clock frequencies decreases. In advantageous embodiments, it is also possible for just three defined clock frequencies or five defined clock frequencies to be provided.

In accordance with a further embodiment of the control device, an assignment unit is provided, which is configured to assign a defined clock frequency from the plurality of defined clock frequencies to each of the duty ratios that are settable for the PWM signal.

This embodiment has the advantage that the assignment of the defined clock frequencies to the settable duty ratios can be carried out independently of an implementation of the modulator unit. The assignment can be carried out using a table, for example, in which a defined clock frequency is assigned to each duty ratio. For this purpose, the assignment unit can be embodied cost-effectively as a storage unit, for example. Alternatively, the assignment by the assignment unit can also be effected using an optimization method dependent for example on various input parameters such as, for example, a voltage level, a temperature, an operating time, a user input and/or system parameters. For this purpose, the assignment unit is implemented for example as an FPGA (Field Programmable Gate Array), a CPU (Central Processing Unit), a PLC (Programmable Logic Controller), a CMOS circuit (Complementary Metal-Oxide-Semiconductor).

In accordance with a further embodiment of the control device, an assignment unit is provided, which is configured to subdivide the duty ratios that are settable for the PWM signal into a plurality of intervals and to assign a defined clock frequency from the plurality of defined clock frequencies to each interval.

The advantage of division into intervals is that there may be no problems if, for example, the duty ratio to be set lies exactly between two duty ratios with a defined value. This can result in an undefined state and thus result in problems. Moreover, it is thus possible to save memory space in the assignment unit.

The division into intervals can be prescribed, for example. For example, provision can be made for dividing the duty ratio interval [0; 1] into three intervals: [0; 0.3], [0.3; 0.7], [0.7; 1]. Alternatively, the division into intervals can be carried out depending on input parameters such as a voltage level, a temperature, an operating time, a user input and/or system parameters. In this case, both the number of intervals and the interval limits are variable.

In accordance with a further embodiment of the control device, the modulator unit is configured, depending on the position to be set of the optical element, to determine a defined duty ratio, to determine the defined clock frequency assigned to the determined duty ratio in the assignment unit, and to provide the PWM signal having the determined duty ratio and the determined defined clock frequency.

This embodiment ensures that each position to be set is set via the duty ratio with an optimum clock frequency.

By way of example, the modulator unit has a signal input, for receiving a position signal corresponding to the position to be set. The modulator unit samples the position signal and thus determines the duty ratio to be set. The modulator unit subsequently retrieves from the assignment unit the clock frequency with which the determined duty ratio is intended to be generated. The retrieving can also be described as providing, wherein the modulator unit firstly provides the duty ratio to be set to the assignment unit and the latter thereupon provides the clock frequency assigned to the duty ratio to the modulator unit.

In particular, the modulator unit and the assignment unit can be provided in a single component.

In accordance with a further embodiment of the control device, each respective defined clock frequency of the plurality of defined clock frequencies is an integer multiple of a basic clock frequency, wherein the basic clock frequency is in the range of 10 kHz-1 MHz and the integer multiple is defined by multiplication by a factor n.

This embodiment advantageously makes it possible to use only one clock generator for generating the defined clock frequencies, wherein the further clock frequencies are derivable from the basic clock frequency. This simplifies the implementation since the number of components used is fewer than if a dedicated clock generator is used for each defined clock frequency.

The basic clock frequency can be equal to the clock frequency generated by the clock generator, but it can also deviate therefrom.

The use of integer multiples of a basic clock frequency makes it possible, using resonance effects, to choose a basic clock frequency which does not interact with other system components, and thus to avoid an interference potential. By way of example, standing waves form in the case of harmonics that represent an integer multiple of a fundamental. Choosing the basic clock frequency such that it does not generate resonance therefore simultaneously ensures that the further defined clock frequencies are also unproblematic in this regard.

It is also technically easier to generate an integer multiple of a clock frequency than a fractional rational multiple, for example.

In accordance with a further embodiment, each of the defined clock frequencies is generated on the basis of a basic clock frequency by multiplication by a fractional rational factor.

In accordance with a further embodiment of the control device, factors $n_1, n_2, \ldots, n_k$ for generating different clock frequencies $f_1, f_2, \ldots, f_k$, wherein $f_k = f_0 \cdot n_k$, form an interrupted sequence of natural numbers and $n_1 = 1$.

This makes it possible to generate a discrete spectrum of defined clock frequencies, wherein the clock frequencies are also generable by summation.

An uninterrupted sequence is, for example, $\{1, 2, 3, 4, 5, 6\}$. Given a basic clock frequency of $f_0 = 100$ kHz, the plurality of defined clock frequencies is thus $\{100, 200, 300, 400, 500, 600\}$ kHz.

In accordance with a further embodiment of the control device, the basic clock frequency is a clock frequency derived from a system clock frequency.

This embodiment advantageously makes it possible to use a clock frequency already present in the system for generating the defined clock frequencies, such as, for example, a system clock frequency and/or a system clock. This simplifies the implementation since fewer components are used, and simultaneously ensures that the individual system components are controlled in a synchronized manner.

In accordance with a further embodiment of the control device, a defined clock frequency is assigned to a respective one of the duty ratios depending on a power loss, a current signal and/or a voltage signal of the control device and/or a system parameter of the lithography apparatus.

This embodiment makes it possible to assign an optimum clock frequency for each system state and each duty ratio. In this case, the system state encompasses all variable parameters that describe a state of the control device and/or of the lithography apparatus. In particular, these include the power loss, the current signal, the voltage signal, a temperature and/or a user input.

In accordance with a further embodiment of the control device, each defined clock frequency of the plurality of defined clock frequencies is defined depending on at least one system parameter.

This embodiment makes it possible to assign an optimum clock frequency for each system state and each duty ratio. In this case, the system state encompasses all variable parameters that describe a state of the control device and/or of the lithography apparatus. In particular, these include the power loss, the current signal, the voltage signal, a temperature and/or a user input.

In accordance with a further embodiment of the control device, the modulator unit is embodied as a digital circuit.

In accordance with a further embodiment of the control device, the actuator unit is embodied as an electromechanical actuator, as an inductive actuator and/or as a capacitive actuator.

A Lorentz actuator is one example of an inductive actuator. In this case, a magnetic field is generated dynamically by an electromagnet, the magnetic field interacting with the magnetic field of a permanent magnet and thus generating an attractive or repulsive force. A piezoactuator is one example of a capacitive actuator. In this case, a force is generated by applying a voltage via the piezoelectric effect, which force can be attractive or repulsive. An electromechanical actuator includes an electric motor, for example, which can drive a gearing spindle.

In accordance with a further embodiment of the control device, a power loss of the amplifier unit for each duty ratio is less than 60% of a maximum power loss of the amplifier unit for a clock frequency that is high in comparison with the basic clock frequency. Furthermore, an amplitude of a superposed AC current in a supply line to the amplifier unit and an amplitude of a superposed AC voltage at an output of the amplifier unit for each duty ratio is in each case less than 25% of a maximum amplitude of the superposed AC current and the superposed AC voltage for the basic clock frequency.

In accordance with a further embodiment of the control device, the control device is embodied as a switching amplifier.

The above-described embodiments of the control device have the following advantages, in particular. The maximum occurring ripple currents in the supply lines to the amplifier unit and in the amplifier unit itself are limited, which has a positive effect particularly for medium duty ratios, for example between 0.25 and 0.75. This fosters, in particular, low cross-influencing between a plurality of control devices. Furthermore, a smaller number and/or a smaller geometric size of block capacitors for providing the amplifying DC voltage are/is used. The maximum occurring ripple voltages at the outputs of the control device, and thus also at the actuator unit, are limited as well. This fosters, in particular, a low electromagnetic emission of the system, low cross-influencing between different actuator units in the lithography apparatus, and also low cross-influencing of other sensors of the lithography apparatus.

Furthermore, the power loss and thus also the waste heat of the control device are limited. This results in an increased lifetime of the control device and a lower heat input into the lithography apparatus, which allows cooling devices that are used to be fashioned more simply. Furthermore, a very large range of duty ratios can be established, whilst maintaining a minimum pulse width. This allows, in particular, an optimum utilization of the supply voltage and also a high power efficiency of the amplifier unit (low power loss and waste heat).

Moreover, by using a discrete number of defined clock frequencies in a narrow frequency range, it is possible to use amplifier units having a limited upper bandwidth, but thus also with a high possible supply voltage. Furthermore, cross-influencing of further electrical components of the lithography apparatus which operate in defined frequency ranges, for example, can be avoided. The generation of the defined clock frequencies is also possible in a simplified manner since they can be derived from an existing system clock in a simple manner.

The respective unit, for example the modulator unit or the assignment unit, can be implemented by way of hardware technology and/or software technology. In the case of an implementation in terms of hardware technology, the respective unit can be embodied as a device or as part of a device, for example as a computer or as a microprocessor. In the case of an implementation in terms of software technology, the respective unit can be embodied as a computer program product, as a function, as a routine, as part of a program code or as an executable object.

In accordance with a second aspect, a lithography apparatus including a control device for actuating an actuator unit for setting a position of an optical element of the lithography apparatus is proposed. The control device corresponds, in particular, to one of the embodiments of the first aspect.

In particular on account of the advantages of such a control device as already mentioned with respect to the first aspect, such a lithography apparatus can be constructed more simply and also achieve an improved imaging performance, for example improved resolution.

The control device of the lithography apparatus corresponds, in particular, to one of the embodiments of the control device of the first aspect.

In accordance with a third aspect, a method for operating a control device of a lithography apparatus is proposed. The lithography apparatus includes at least one optical element whose position is settable via an actuator unit assigned to the optical element, wherein the control device is configured for actuating the actuator unit. The method includes at least the following steps: Determining a duty ratio of a PWM signal depending on a position to be set of the optical element; determining a defined clock frequency from a plurality of defined clock frequencies depending on the determined duty ratios; providing the PWM signal having the determined duty ratio and the determined clock frequency; and amplifying the PWM signal with the voltage signal for providing the control signal for setting the position of the optical element.

This method makes it possible to achieve the advantages outlined above in particular with a lithography apparatus in accordance with the second aspect including a control device in accordance with the first aspect.

Furthermore, a computer program product is proposed, the computer program product causing the method as explained above to be carried out on a program-controlled device.

A computer program product, such as e.g. a computer program, can be provided or supplied, for example, as a storage medium, such as e.g. a memory card, a USB stick, a CD-ROM, a DVD, or else in the form of a downloadable file from a server in a network. By way of example, in the case of a wireless communications network, this can be effected by transferring an appropriate file with the computer program product or the computer program.

The embodiments and features described for the proposed control device are correspondingly applicable to the proposed method.

Further possible implementations of the disclosure also include not explicitly mentioned combinations of features or embodiments that are described above or below with respect to the exemplary embodiments. In this case, the person skilled in the art will also add individual aspects as improvements or supplementations to the respective basic form of the disclosure.

BRIEF DESCRIPTION OF THE DRAWINGS

Further advantageous configurations and aspects of the disclosure are the subject matter of the dependent claims and also of the exemplary embodiments of the disclosure described below. The disclosure is explained in greater detail below on the basis of preferred embodiments with reference to the accompanying figures.

EXEMPLARY EMBODIMENTS OF THE DISCLOSURE

Identical elements or elements having an identical function have been provided with the same reference signs in the figures, unless indicated otherwise.

Figure 1A:
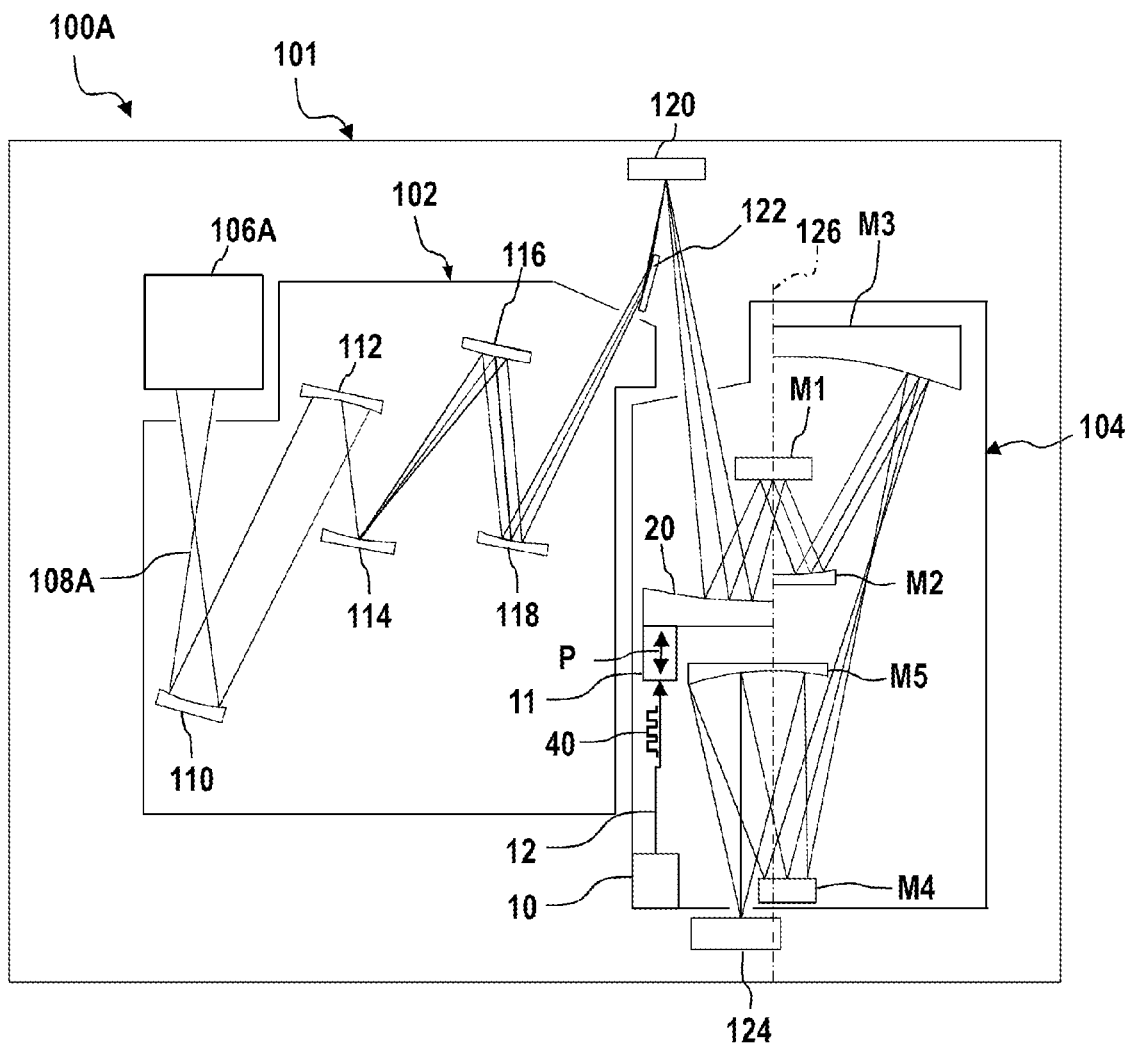
FIG. 1A shows a schematic view of an EUV lithography apparatus including a control device and an actuator unit.

FIG. 1A shows a schematic view of an EUV lithography apparatus 100A, which includes a beam shaping and illumination system 102 and a projection system 104. In this case, EUV stands for "extreme ultraviolet" (EUV) and denotes a wavelength of the working light (also called used radiation) of between 0.1 and 30 nm. The beam shaping and illumination system 102 and the projection system 104 are arranged in a vacuum housing 101. The vacuum housing 101 is evacuated with the aid of an evacuation device (not illustrated).

The EUV lithography apparatus 100A includes an EUV light source 106A. A plasma source (or a synchrotron), which emits radiation 108A in the EUV range (extreme ultraviolet range), i.e., for example, in the wavelength range of 0.1 nm to 30 nm, can be provided, for example, as the EUV light source 106A. In the beam shaping and illumination system 102, the EUV radiation 108A is focused and the desired operating wavelength is filtered out from the EUV radiation 108A. The EUV radiation 108A generated by the EUV light source 106A has a relatively low transmissivity through air, for which reason the beam guiding spaces in the beam shaping and illumination system 102 and in the projection system 104 are evacuated.

The beam shaping and illumination system 102 illustrated in FIG. 1A has five mirrors 110, 112, 114, 116, 118. After passing through the beam shaping and illumination system 102, the EUV radiation 108A is directed onto the photomask (reticle) 120. The photomask 120 is embodied for example as a reflective optical element and can be arranged outside the systems 102, 104. Furthermore, the EUV radiation 108A can be directed onto the photomask 120 via a mirror 122. The photomask 120 includes structures which are imaged onto a wafer 124 or the like in a reduced manner via the projection system 104. In this case, the wafer 124 is arranged in the image plane of the projection system 104.

The projection system 104 (also referred to as projection lens) has six mirrors M1-M5, 20 for imaging the photomask 120 onto the wafer 124. In this case, individual mirrors M1-M5, 20 of the projection system 104 can be arranged symmetrically in relation to the optical axis 126 of the projection system 104. It should be noted that the number of mirrors of the EUV lithography apparatus 100A is not restricted to the number illustrated. More or fewer mirrors can also be provided. Furthermore, the mirrors, as a rule, are curved on their front side for beam shaping.

In the example in FIG. 1A, in particular, the mirror 20 is mounted movably and an actuator unit 11 embodied as a Lorentz actuator 11 is arranged at the mirror 20. The Lorentz actuator 11 is configured to set a position P of the mirror 20 in a range of 0-500 µm along a prescribed axis. In this case, the position P to be set is transmitted via a control signal 40 from a control device 10 via a signal connection 12. The control signal 40 has the effect that the Lorentz actuator 11 moves to the position P to be set. Over and above the illustration in FIG. 1, it is furthermore possible to provide a plurality of actuator units at a plurality of movably mounted parts of a mirror module. By way of example, a mirror module can also include a plurality of individual mirrors that are actuatable in each case individually and independently of one another.

The control device 10 can also be arranged outside the projection system 104 and/or evacuated housing 101. Furthermore, further mirrors can be mounted movably and be equipped with actuator units 11 assigned thereto. Moreover, the movably mounted mirrors are preferably equipped with a plurality of actuator units 11 in order to enable movement in all three spatial axes.

Figure 1B:
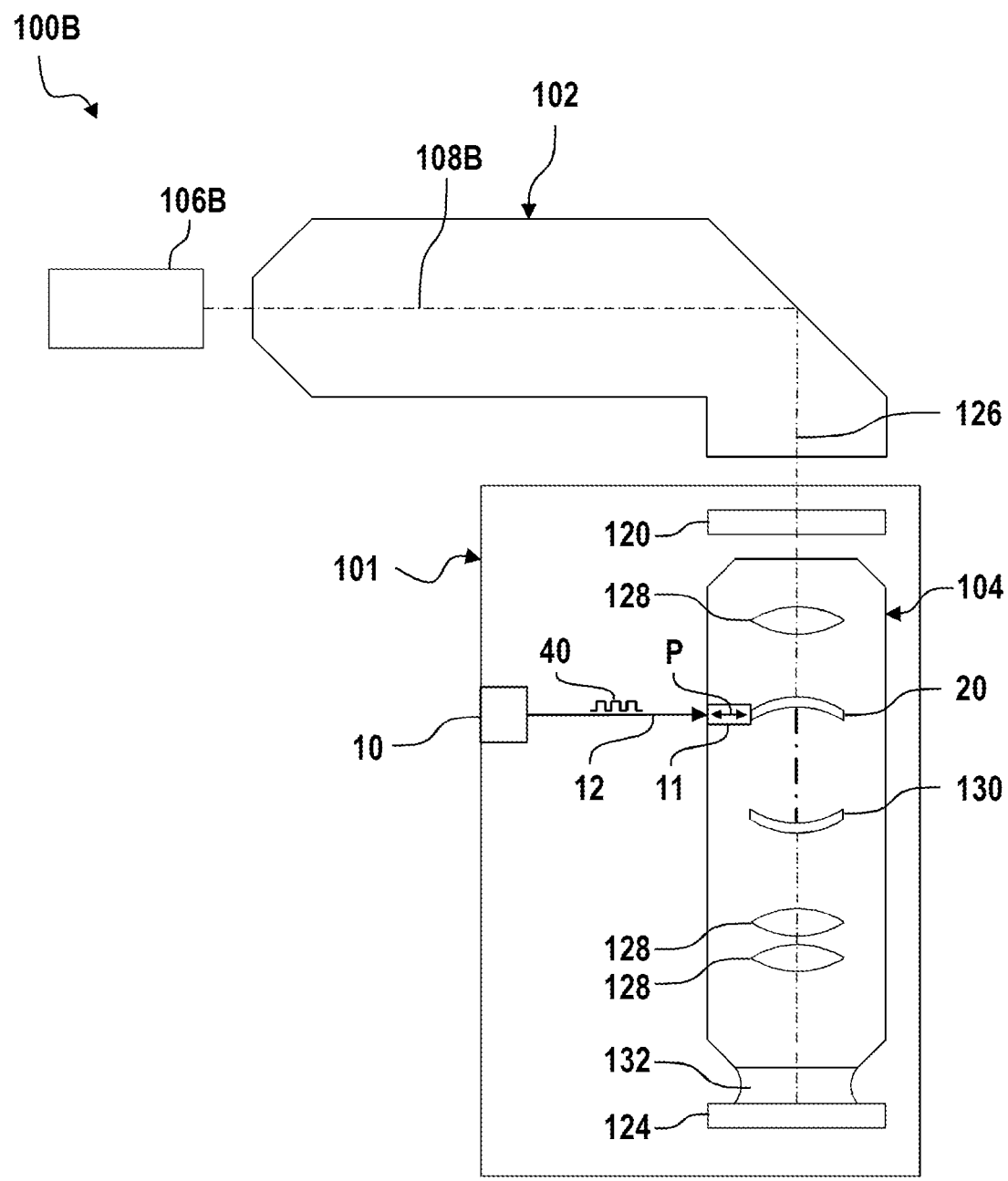
FIG. 1B shows a schematic view of a DUV lithography apparatus including a control device and an actuator unit.

FIG. 1B shows a schematic view of a DUV lithography apparatus 100B, which includes a beam shaping and illumination system 102 and a projection system 104. In this case, DUV stands for "deep ultraviolet" (DUV) and denotes a wavelength of the working light (also called used radiation) of between 30 and 250 nm. The beam shaping and illumination system 102 and the projection system 104—as already described with reference to FIG. 1A—can be arranged in a vacuum housing. FIG. 1B only shows a vacuum housing 101 including the projection system 104, the photomask 120 and a control device 10.

The DUV lithography apparatus 100B has a DUV light source 106B. By way of example, an ArF excimer laser that emits radiation 108B in the DUV range at 193 nm, for example, can be provided as the DUV light source 106B.

The beam shaping and illumination system 102 illustrated in FIG. 1B guides the DUV radiation 108B onto a photomask 120. The photomask 120 is embodied as a transmissive optical element and can be arranged outside the systems 102, 104. The photomask 120 includes structures which are imaged onto a wafer 124 or the like in a reduced manner via the projection system 104. In this case, the wafer 124 is arranged in the image plane of the projection system 104.

The projection system 104 has a plurality of lens elements 128 and/or mirrors 20, 130 for imaging the photomask 120 onto the wafer 124. In this case, individual lens elements 128 and/or mirrors 20, 130 of the projection system 104 can be arranged symmetrically in relation to the optical axis 126 of the projection system 104. It should be noted that the number of lens elements and mirrors of the DUV lithography apparatus 100B is not restricted to the number illustrated. More or fewer lens elements and/or mirrors can also be provided. Furthermore, the mirrors are generally curved on their front side for beam shaping.

In the example in FIG. 1B, in particular, the mirror 20 is mounted movably and is equipped with an actuator unit 11, embodied here as an electromechanical actuator 11. The electromechanical actuator 11 is configured to set a position P of the mirror 20 along an axis in a range of 0-5 mm. The position P to be set is set via a control signal 40 generated by the control device 10. In this case, the control signal 40 is transmitted via a signal connection 12 to the electromechanical actuator 11.

Over and above the illustration in FIG. 1B, it can be provided that one or a plurality of the lens elements 128 and of the mirrors 130 can be mounted movably and be equipped with a respective actuator unit 11. As already described in relation to FIG. 1A, provision can advantageously be made for assigning a plurality of actuator units 11 for movement in all three spatial directions and/or tiltings to an optical element 20. An option equivalent thereto is if a single actuator unit 11 is provided, which can implement a movement in all spatial directions and/or tiltings.

Figure 2:
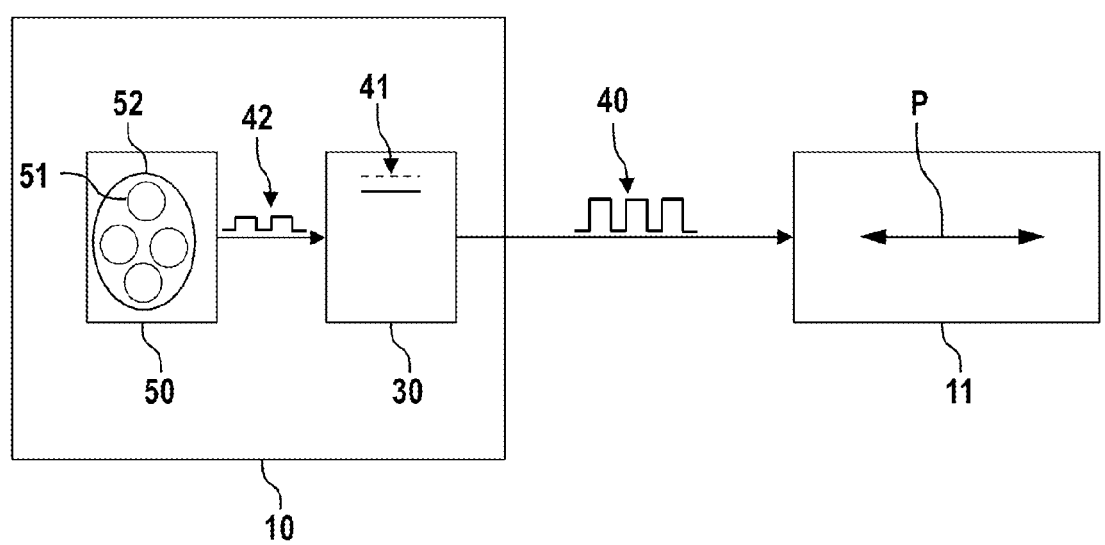
FIG. 2 shows one exemplary embodiment of a control device for actuating an actuator unit.

FIG. 2 shows one exemplary embodiment of a control device 10 for actuating an actuator unit 11. The embodiment illustrated is suitable, for example, for setting a position P of an optical element 20 in one of the lithography apparatuses 100A, 100B from FIGS. 1A, 1B. For the sake of simplicity, the optical element is not illustrated in the illustration in FIG. 2.

The control device 10 includes a modulator unit 50 which is embodied here as a digital circuit, and an amplifier unit 30, which is likewise embodied as a digital circuit. The control device 10 in FIG. 2 may be referred to overall as a switching amplifier 10.

The modulator unit 50 is configured, in particular, to provide a PWM signal 42 having a duty ratio 43 with a defined clock frequency 51 from a plurality of defined clock frequencies 52. In the example, the modulator unit 50 is configured to generate duty ratios 43 in the range of at least 0.25-0.75, wherein the plurality of clock frequencies 52 are based on a basic clock frequency $f_0$. The basic clock frequency $f_0$ is in the range of 10 kHz-100 kHz, for example. By way of example, the basic clock frequency is $f_0$=55 kHz, wherein the plurality of clock frequencies 52 thus includes the clock frequencies 55 kHz, 110 kHz, 165 kHz and 220 kHz, for example. The defined clock frequency 51 is 110 kHz, for example, and the duty ratio 43 is 0.3.

The amplifier unit 30 receives the PWM signal 42 and amplifies it using a voltage signal 41, which here is a DC voltage signal having a level of between 10 V and 100 V, for example 50 V. The control signal 40 thus corresponds to the PWM signal 42, which jumps between the levels 0 and 50 V, depending on the switching state. With the duty ratio of 0.3, a mean value of the control signal 40 of 15 V thus results. This control signal 40 is transmitted to the actuator unit 11. The actuator unit 11 thus moves to the position P corresponding to a signal having a level of 15 V.

Figure 3A:
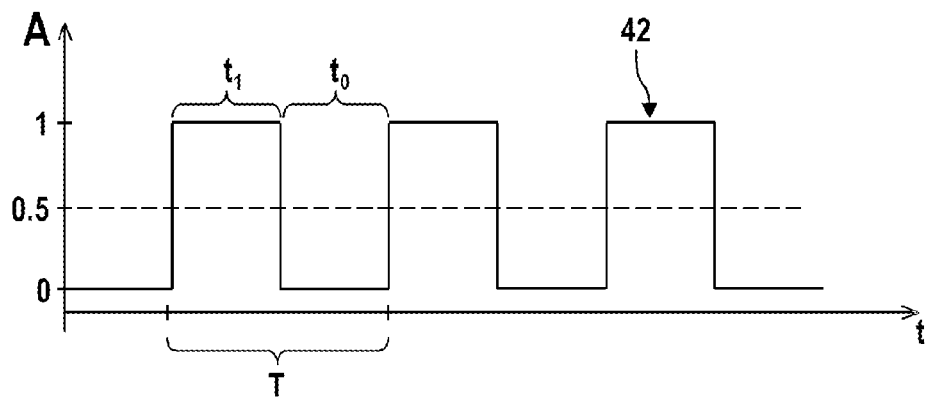
FIG. 3A shows a first exemplary embodiment of a PWM signal having a duty ratio of 0.5 and a defined clock frequency.

FIG. 3A shows a first exemplary embodiment of a PWM signal 42 having a duty ratio 43 of 0.5 and a defined clock frequency 51. The illustration shows a diagram having an abscissa t (time axis) and an ordinate axis A (amplitude of the PWM signal 42). In the example, the two levels of the PWM signal 42 are 0 and 1. In this specific case, the duty ratio 43 corresponds to the average value of the signal 42 over time. The clock frequency 51 results from the illustration as a reciprocal fraction of the shown period duration T of the signal 42. The illustration shows a total of three periods T of the signal 42.

A period T of the signal 42 is composed of a first time interval $t_1$, during which the level of the signal 42 is at 1, and a second time interval $t_0$, during which the level of the signal 42 is at 0. The duty ratio 43 can be calculated from these values in accordance with equation 2:

$$\tau = t_1/T = t_1/(t_1+t_0) \quad \text{(Equation 2)}$$

In the present case, $t_1=t_0$, which results in $\tau=0.5$.

Figure 3B:
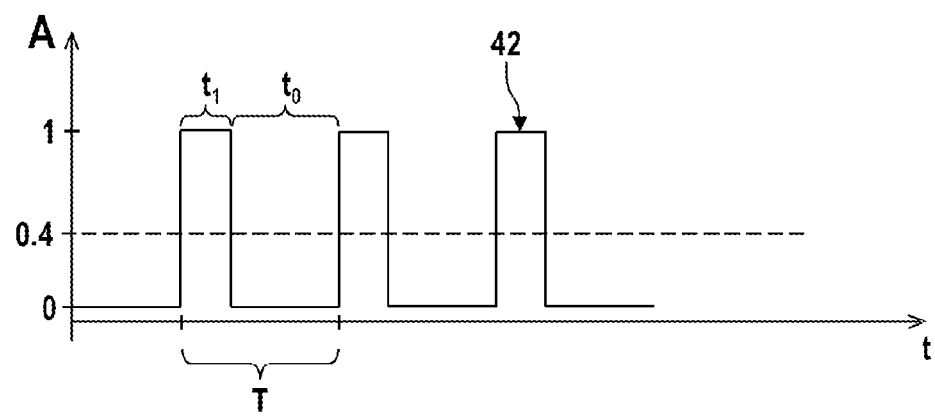
FIG. 3B shows a second exemplary embodiment of a PWM signal having a duty ratio of 0.4 and a defined clock frequency.

FIG. 3B shows a second exemplary embodiment of a PWM signal 42 having a duty ratio 43 of 0.4 and a defined clock frequency. The illustration corresponds to that in FIG. 3A, with the difference that the time intervals $t_1$, $t_0$ have different values, thus resulting in a different period duration T and a different duty ratio 43. The defined clock frequency 51 results in turn from the period duration T, the clock frequency being higher in the present case than in FIG. 3A.

Figure 3C:
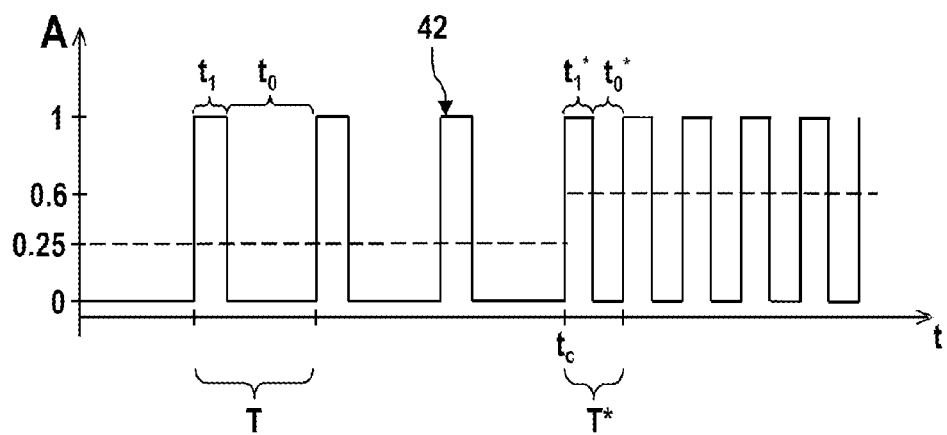
FIG. 3C shows a third exemplary embodiment of a PWM signal having two different duty ratios, which are provided with different defined clock frequencies.

FIG. 3C shows a third exemplary embodiment of a PWM signal 42 having two different duty ratios 43, which are provided with different defined clock frequencies 51. The illustration corresponds to that in FIGS. 3A and 3B, with a different PWM signal 42.

In FIG. 3C, the time axis is divided into two ranges by a point in time $t_c$. At times less than $t_c$, the PWM signal 42 has a duty ratio 43 of 0.25, which is generated with a relatively low clock frequency 51 corresponding to the reciprocal of the period T. In the example, the defined clock frequency 51 is 110 kHz, and so the period duration is T=9.1 μs. Furthermore, $t_1$=2.3 μs and $t_0$=6.8 μs.

Figure 4:
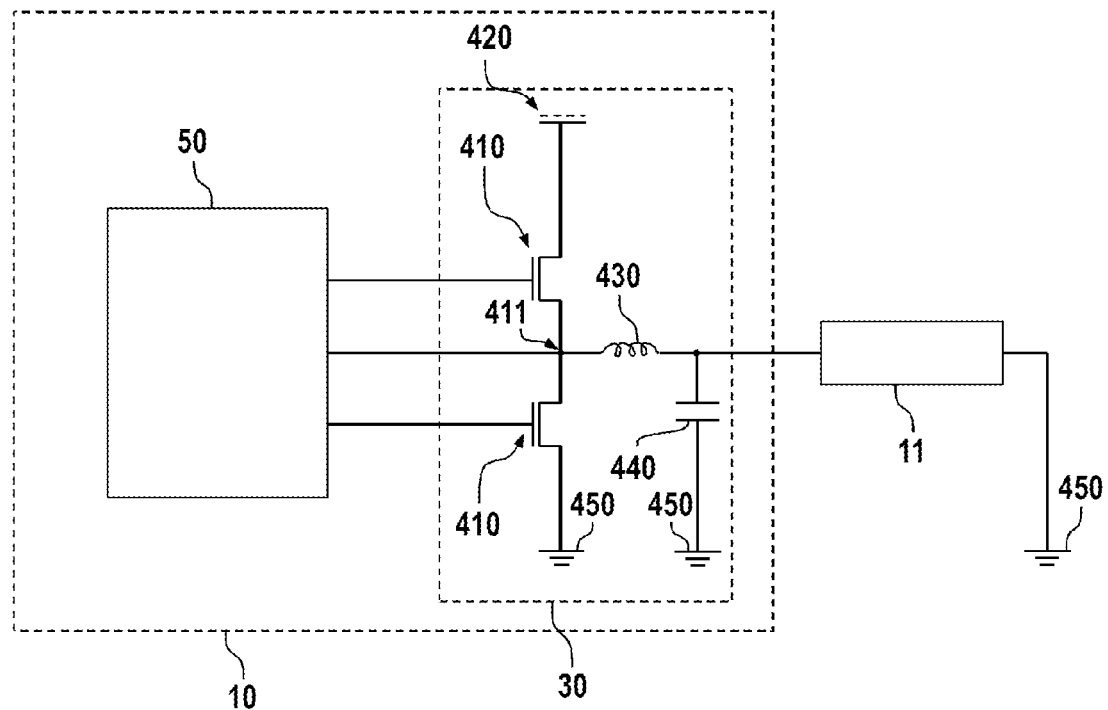
FIG. 4 shows one exemplary circuit arrangement for implementing a control device.
Figure 5:
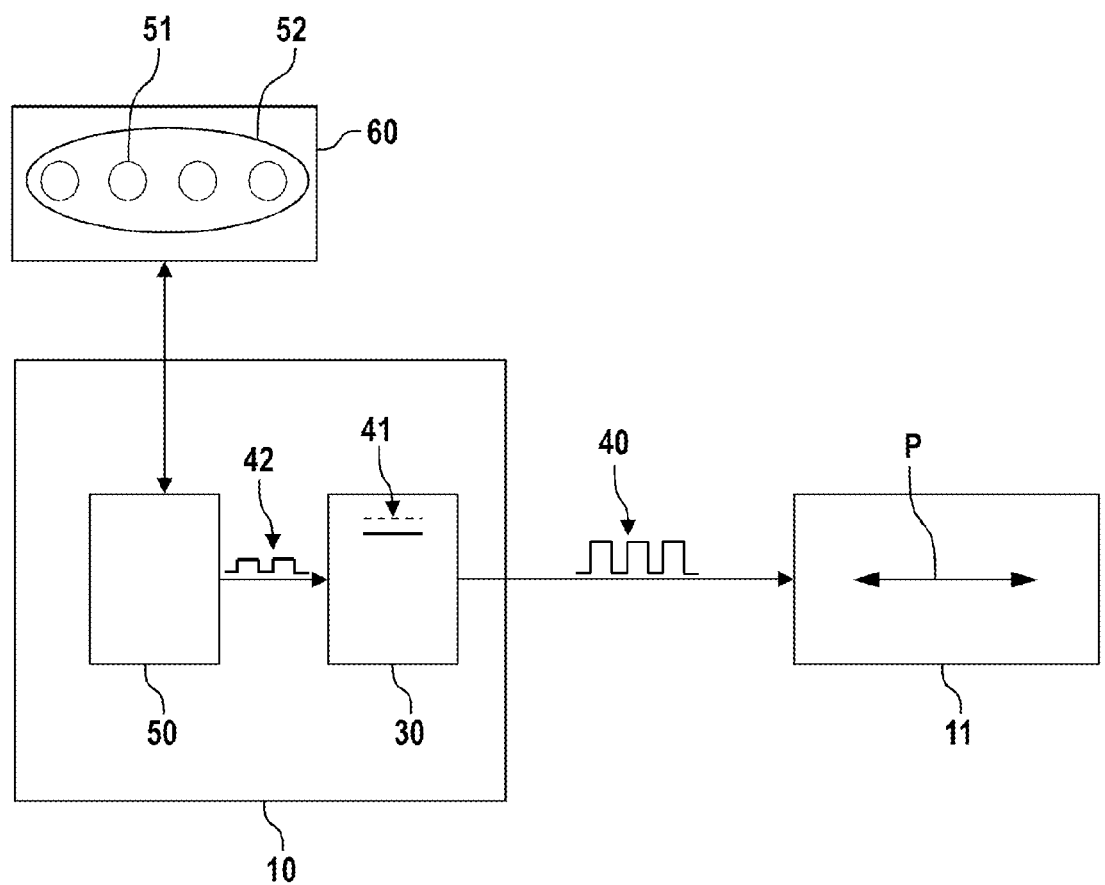
FIG. 5 shows a further exemplary embodiment of a control device for actuating an actuator unit including an assignment unit.

At the point in time $t_c$, the position P to be set of the actuator unit 11 changes (see e.g. FIGS. 2, 4, 5). A duty ratio 43 of 0.6 is used for the position P to be set. On account of boundary conditions involving, in particular, a minimization of the power loss of the amplifier unit 30 and at the same time a minimization of ripple current and ripple voltage, the duty ratio 43 is generated with a defined clock frequency 51 that is different than the first clock frequency. In the example, the new defined clock frequency 51 is 220 kHz, which corresponds to double the first clock frequency 51. Therefore, T*=4.5 μs and $t_1$*=2.7 μs and $t_0$*=1.8 μs.

FIG. 4 shows one exemplary circuit arrangement for implementing a control device 10 for actuating an actuator unit 11. The arrangement shown can be used for example in a control device 10 in any of FIGS. 1A, 1B, 2, 5.

The modulator unit 50 is configured to amplify the PWM signal 42 to be amplified on two switching transistors 410. As a result, at the node 411, the supply voltage 420 is switched in accordance with the PWM signal 42. That is to say that the control signal 40 is present at the node 411. The coil 430 and the capacitor 440 form an output filter that filters out high-frequency interference signals from the control signal 40. The control signal 40 is transmitted to the actuator unit 11, which moves to a position P corresponding to the control signal 40. All voltages in the present case correspond to the potential difference of a point relative to a reference potential 450, e.g. a ground potential.

FIG. 5 shows a further exemplary embodiment of a control device 10 for actuating an actuator unit 11. The embodiment illustrated has the features of the embodiment illustrated in FIG. 2, wherein in FIG. 5 an assignment unit 60 is provided, which is configured to assign a defined clock frequency 51 from a plurality of clock frequencies 52 to each duty ratio 42. Such an assignment unit 60 can also be provided in the lithography apparatuses 100A, 100B in FIGS. 1A, 1B.

The assignment unit 60 is configured, in particular, to select the defined clock frequency 51 on the basis of a determined duty ratio 42. In this case, selecting also includes detecting parameter values, such as, for example, a temperature (not illustrated). Depending on these parameter values, the assignment unit 60 assigns a defined clock frequency 51 to the determined duty ratio 42. The assigned clock frequency 51 is provided to the modulator unit 50, which generates the PWM signal 42 having the duty ratio 43 and the clock frequency 51.

As an alternative to an assignment depending on parameter values, provision can be made for the assignment unit 60 to subdivide the settable duty ratios 42 into a plurality of intervals and to assign a defined clock frequency 51 to each interval. A subdivision of this type is shown in FIG. 6A.

Figure 6A:
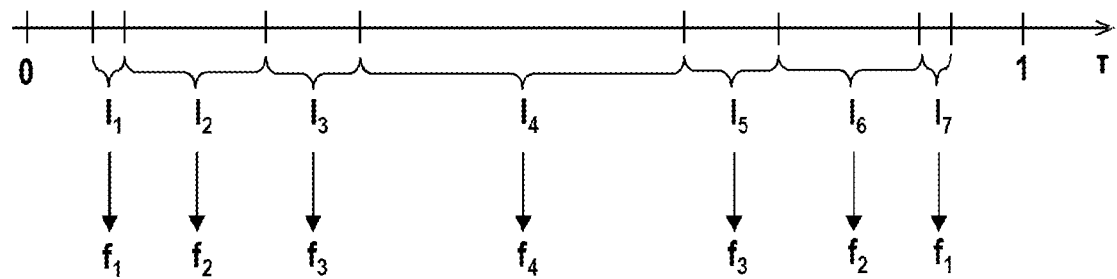
FIG. 6A shows one exemplary subdivision of the duty ratio range of 0.1-0.9 into a plurality of intervals, each of which is respectively assigned a defined clock frequency.

FIG. 6A shows an exemplary subdivision of the duty ratio range of 0.1-0.9 into six intervals $I_1$-$I_7$, each of which is assigned a defined clock frequency 51 from the plurality of clock frequencies 52, including four different clock frequencies $f_1$, $f_2$, $f_3$ and $f_4$.

The subdivision of the duty ratio range into the intervals $I_1$-$I_7$ and the assignment of the clock frequencies 51 to these intervals $I_1$-$I_7$ result from a consideration of the ripple current, the ripple voltage and the power loss of the switching amplifier 10 used. These are shown for the different clock frequencies in FIGS. 7A-7C. Firstly, an explanation of how the plurality of defined clock frequencies 52 is generated will be explained with reference to FIG. 6B.

Figure 6B:
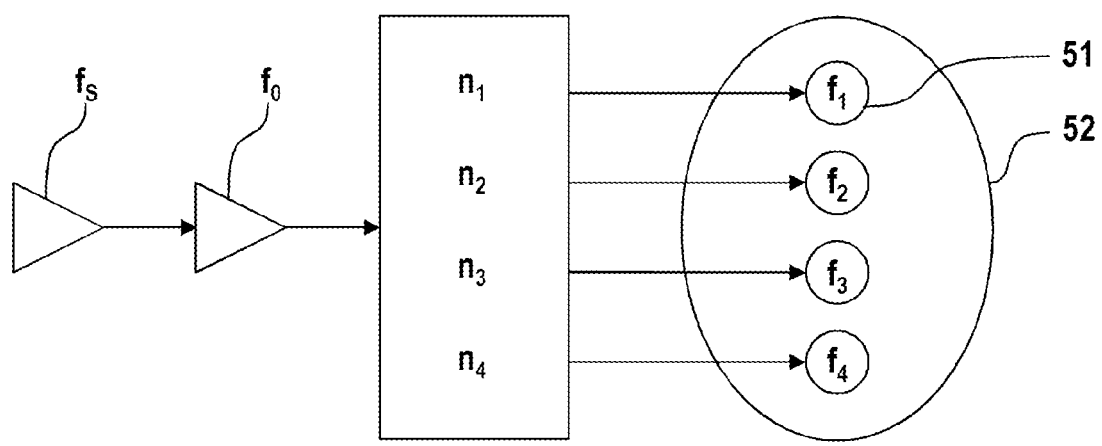
FIG. 6B shows one possibility for generating a plurality of clock frequencies on the basis of a system clock frequency.

FIG. 6B shows one exemplary embodiment of how the plurality of defined clock frequencies 52 in Table 1 is generated from a system clock frequency $f_S$. The example in FIG. 6B is based on a system clock frequency $f_S$ of 100 MHz, from which is derived, via a factor of 1818, a basic clock frequency $f_0$=100 MHz/1818=55 kHz. Multiplying the basic clock frequency $f_0$ by the integer factors $n_1$=1, $n_2$=2, $n_3$=3, $n_4$=4 results in the four different defined clock frequencies $f_1$, $f_2$, $f_3$ and $f_4$.

Figure 7A:
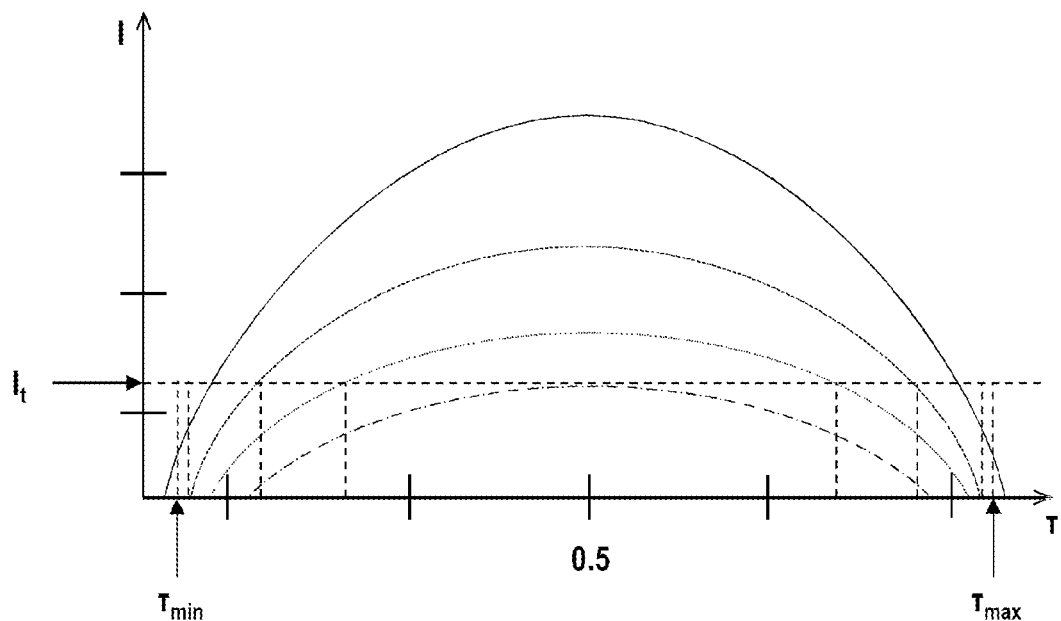
FIG. 7A shows by way of example the amplitude of a ripple current that occurs in the supply line to a switching amplifier in a duty ratio interval for four different clock frequencies.

FIG. 7A shows a diagram of an amplitude I of the ripple current for an exemplary range of duty ratios of 0.1-0.9, shown for the four different defined clock frequencies $f_1$, $f_2$, $f_3$ and $f_4$. The actual amplitude is dependent on the implementation, for which reason no numerical values are indicated here. The curves correspond, numbered consecutively from top to bottom, to the clock frequencies $f_1$=55 kHz, $f_2$=110 kHz, $f_3$=165 kHz and $f_4$=220 kHz. Furthermore, the diagram illustrates a threshold value $I_t$ for the amplitude of the ripple current for example as a dashed line, and also the respective interval limits. It is evident that for a constant clock frequency 51, the amplitude of the ripple current in the supply line is symmetrical around the duty ratio 0.5, the maximum being attained there, too.

Figure 7B:
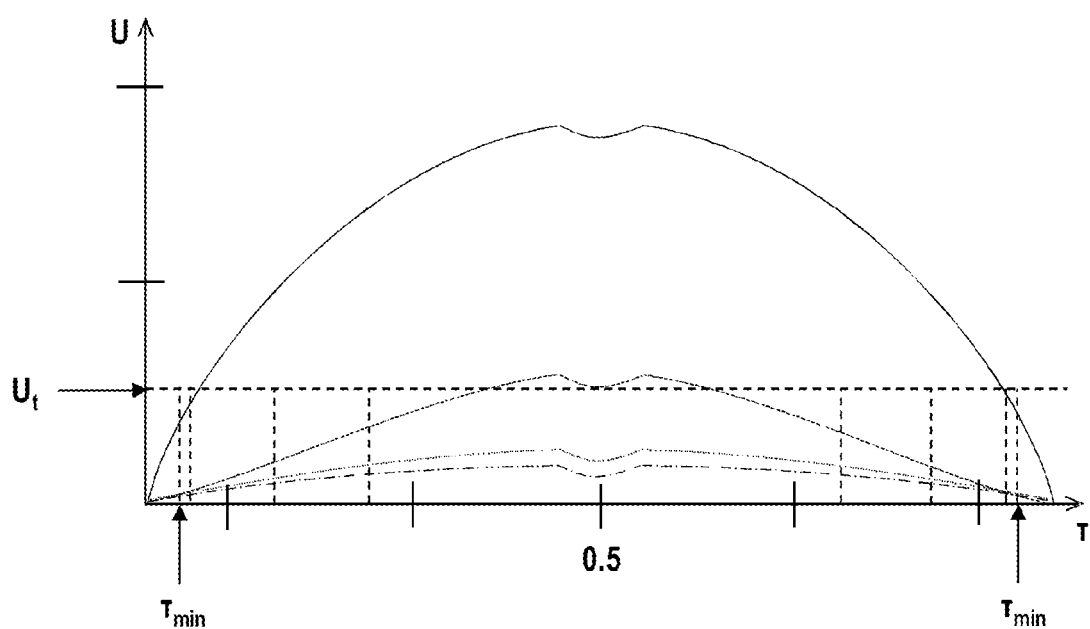
FIG. 7B shows by way of example the amplitude of a ripple voltage that occurs at the output of a switching amplifier in a duty ratio interval for four different clock frequencies.

FIG. 7B shows a diagram as in FIG. 7A, but here the amplitude of the ripple voltage at the output is plotted, likewise without concrete numerical values. The assignment of the curves to the frequencies is as in FIG. 7A. The curves are once again symmetrical around the duty ratio of 0.5, each curve having two maxima lying somewhat above and respectively somewhat below the duty ratio of 0.5. The threshold value is designated for example by $U_t$ and lies for example between 0.5 V-10 V.

Figure 7C:
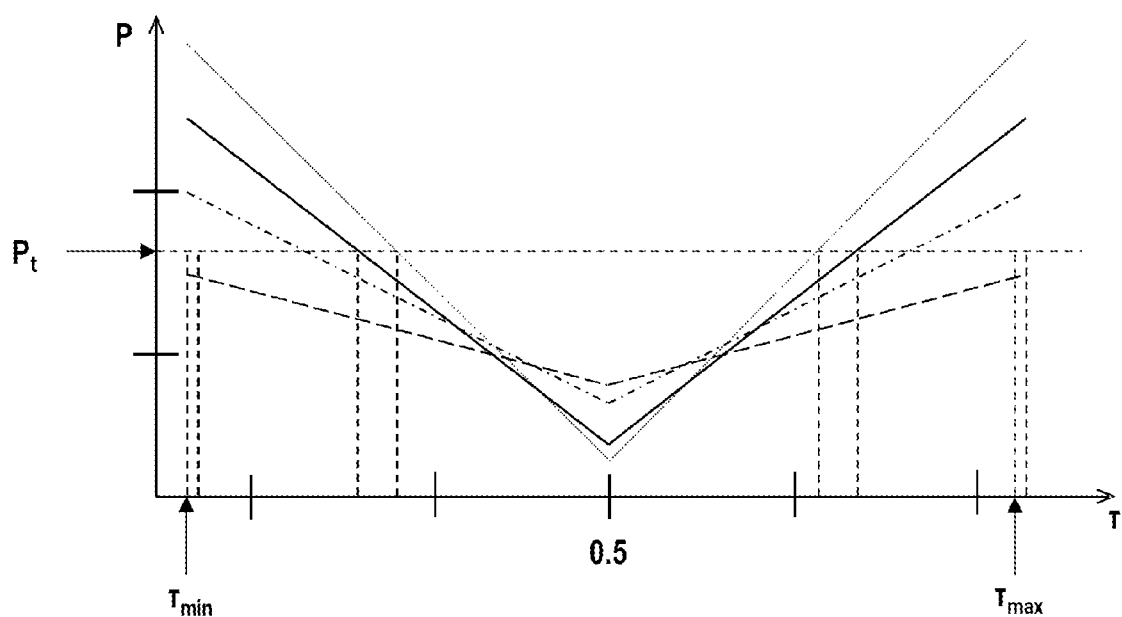
FIG. 7C shows by way of example the power loss that occurs of a switching amplifier in a duty ratio interval for four different clock frequencies.

FIG. 7C shows a further diagram of this type, wherein the power loss of the switching amplifier 10 is plotted here. The assignment of the curves to the clock frequencies 51 is reversed here, i.e. $f_1$, $f_2$, $f_3$ and $f_4$ are arranged from bottom to top here (excluding a small duty ratio range around 0.5 where the curves overlap). The curves likewise proceed symmetrically around a duty ratio of 0.5, although here the value of the power loss increases toward duty ratios lower and higher than 0.5. In this case, the increase is all the greater, the higher the clock frequency 51. A prescribed threshold value for the power loss is depicted by way of example and designated by $P_t$.

A joint consideration of FIGS. 7A-7C reveals then the advantages entailed by a duty-ratio-dependent selection of a defined clock frequency. Only in this way is it possible for the actual value for the amplitude of the ripple current, of the ripple voltage and also of the power loss to remain below the prescribed threshold value for the respective variable for each settable duty ratio.

Figure 8:
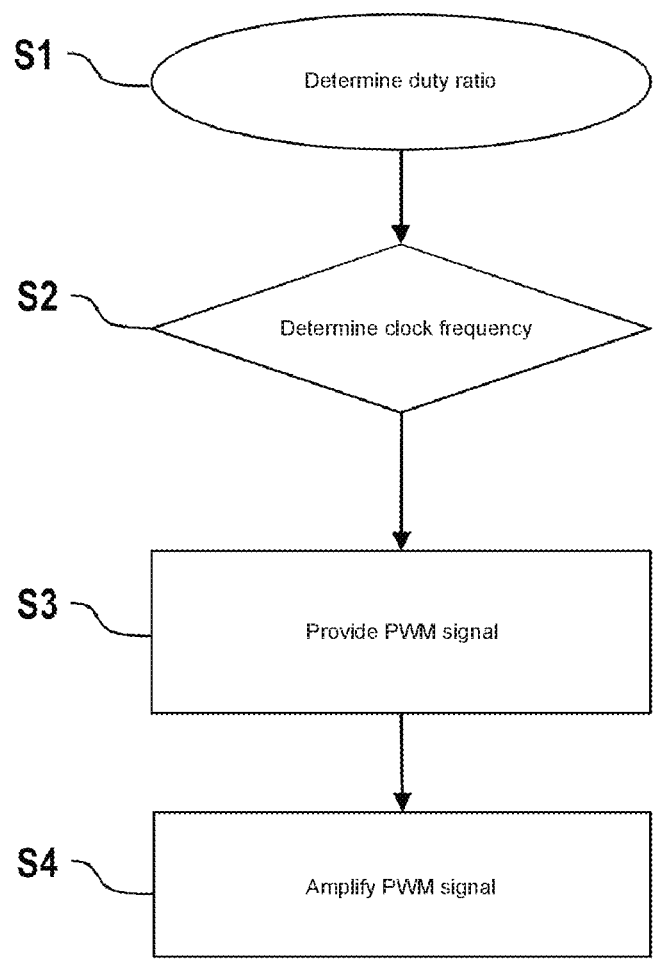
FIG. 8 shows one exemplary embodiment of a method for operating a control device for actuating an actuator unit in a lithography apparatus.

FIG. 8 shows one embodiment of a method for operating a control device 10 for actuating an actuator unit 11 in a lithography apparatus 100A, 100B (see FIG. 1A and FIG. 1B).

The method includes the following steps:

Step S1 involves determining a duty ratio 43 to be set of a PWM signal 42 depending on a position P to be set of an optical element 20 of the lithography apparatus 100A, 100B. From the determined position P, it is possible to derive indirectly the duty ratio 43 with which the actuator unit 11 will be actuated in order to set the position P. For this purpose, the determining S1 includes for example calculating the duty ratio 43 or comparing the position P to be set with an assignment table concerning duty ratios 43.

Step S2 involves determining, depending on the determined duty ratio 43, a clock frequency 51 with which the duty ratio 43 is provided. For this purpose, for example, the determined duty ratio 43 is compared with a table in which the assignment of duty ratios 43 to defined clock frequencies 51 is stored.

Step S3 involves providing the PWM signal 42 now defined unambiguously by the determined clock frequency 51 and the duty ratio 43. Providing means, in particular, that the PWM signal 42 is fed to an amplifier unit 30 in order to generate a control signal 40 for an actuator unit 11.

In step S4, the provided PWM signal 42 is amplified with the voltage signal 41 by the amplifier unit 30 and the control signal 40 is thus generated, which is transmitted to the actuator unit 11. The control signal 40 generated in this way causes the actuator unit 11 to set the position P to be set.

Figure 9:
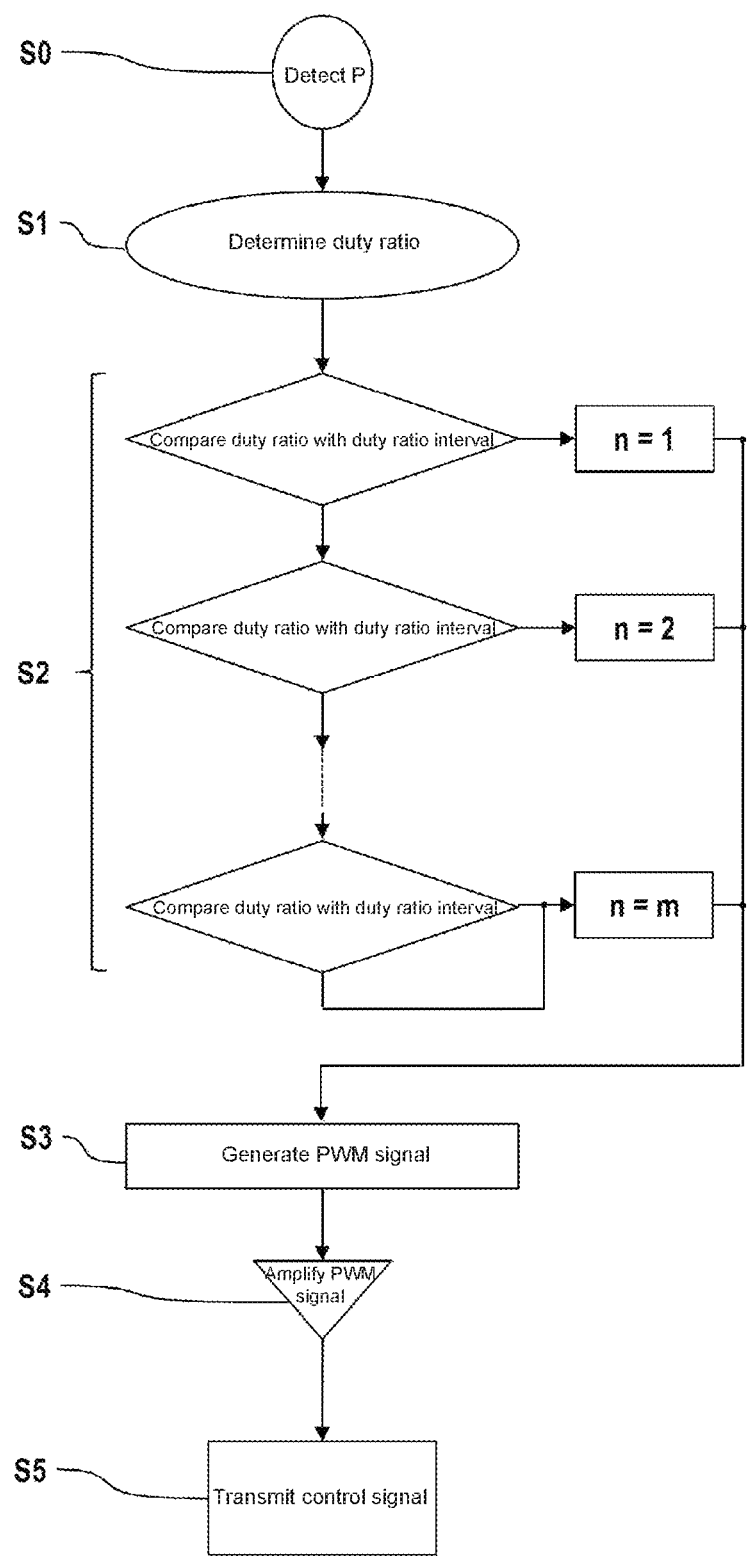
FIG. 9 shows a further exemplary embodiment of a method for operating a control device for actuating an actuator unit in a lithography apparatus.

FIG. 9 shows a further exemplary embodiment of a method for operating a control device 10 for actuating an actuator unit 11 assigned to a mirror 20 of a lithography apparatus 100A, 100B (see e.g. FIGS. 1A, 1B).

Step S0 of the method involves detecting a position P to be set of the mirror 20. This can include for example detecting an output value of a control loop (not illustrated). The position P to be set results for example from a control loop (not illustrated) which manipulates, in particular optimizes, a wavefront of the exposure light.

Step S1 involves determining, from the position P to be set, a desired duty ratio 43 with which the position P is attained via the actuator unit 11.

In step S2, an assignment unit 60 (see FIG. 5) determines a defined clock frequency 51 depending on the determined duty ratio 43. This is done for example by comparison with a table in which an assignment of duty ratio intervals to the factors n that generate the defined clock frequencies 51 is stored. One example of this is table 1, which was explained in association with FIGS. 6A, 6B, 7A, 7B, 7C. The defined clock frequency 51 results directly from the determined factor by multiplication by the basic clock frequency $f_0$.

In step S3, the PWM signal 42 having the determined duty ratio 43 and the determined clock frequency 51 is generated and provided by a modulator unit 50.

In step S4, the provided PWM signal 42 is taken up and amplified by an amplifier unit 30, with the control signal 40 for the actuator unit 11 being generated.

In step S5, the generated control signal 40 is transmitted to the actuator unit 11, with the result that the actuator unit 11 sets the position P to be set.

Although the present disclosure has been described on the basis of exemplary embodiments, it is modifiable in diverse ways.

LIST OF REFERENCE SIGNS

- 10 Control device
- 11 Actuator unit
- 12 Signal connection
- 20 Optical element
- 30 Amplifier unit
- 40 Control signal
- 41 DC voltage signal
- 42 PWM signal
- 43 Duty ratio
- 50 Modulator unit
- 51 Clock frequency
- 52 Plurality of clock frequencies
- 60 Assignment unit
- 100A EUV lithography apparatus
- 100B DUV lithography apparatus
- 101 Vacuum housing
- 102 Beam shaping and illumination system
- 104 Imaging optical unit
- 106A EUV radiation source
- 106B DUV radiation source
- 108A EUV radiation
- 108B DUV radiation
- 110 Mirror
- 112 Mirror
- 114 Mirror
- 116 Mirror
- 118 Mirror
- 120 Lithographic structure
- 122 Mirror
- 124 Wafer with photoactive coating
- 126 Optical axis
- 128 Lens element
- 130 Mirror
- 132 Index-matching liquid
- 410 Switching transistor
- 411 Node
- 420 DC voltage source
- 430 Coil
- 440 Capacitor
- 450 Reference potential
- $f_0$ Basic clock frequency
- $f_1$ Defined clock frequency
- $f_2$ Defined clock frequency
- $f_3$ Defined clock frequency
- $f_4$ Defined clock frequency
- $f_k$ Defined clock frequency
- $f_S$ System clock frequency
- $I_1$ Interval
- $I_2$ Interval
- $I_3$ Interval
- $I_4$ Interval
- $I_5$ Interval
- $I_6$ Interval
- $I_7$ Interval
- $I_t$ Current threshold value
- M1 Mirror
- M2 Mirror
- M3 Mirror
- M4 Mirror
- M5 Mirror
- $n_1$ Integer factor
- $n_2$ Integer factor
- $n_3$ Integer factor
- $n_4$ Integer factor
- $n_k$ Integer factor
- P Position
- $P_t$ Power threshold value
- S0 Method step
- S1 Method step
- S2 Method step
- S3 Method step
- S4 Method step
- S5 Method step
- T Period/Period duration
- $U_t$ Voltage threshold value
- $t_0$ Time interval (level 0)
- $t_0^*$ Time interval (level 0)
- $t_1$ Time interval (level 1)
- $t_1^*$ Time interval (level 1)
- $\tau$ Duty ratio
- $\tau_{max}$ Maximum settable duty ratio
- $\tau_{min}$ Minimum settable duty ratio

What is claimed is:

1. A control device, comprising:
    a modulator unit configured to provide a PWM signal having a duty ratio and a defined clock frequency from a plurality of defined clock frequencies; and
    an amplifier unit configured to provide a control signal to an actuator unit via a voltage signal and the PWM signal,
    wherein:
        the defined clock frequency is an integer multiple of a basic clock frequency;
        the basic clock frequency is in the range of 10 kHz to 1 MHz; and
        the amplifier unit is configured to provide, without interruption, the control signal to the actuator unit:
            i) in a first time interval via a first PWM signal having a first defined clock frequency from the plurality of defined clock frequencies; and
            ii) in a second time interval, directly following the first time interval, via a second PWM signal having a second defined clock frequency from the plurality of defined clock frequencies, the second defined clock frequency being different from the first defined clock frequency.

2. The control device of claim 1, wherein the control device is configured to actuate the actuator unit to set a position of an optical element of a lithography apparatus.

3. The control device of claim 1, wherein the modulator unit is configured to:
    i) depending on a position to be set of an optical element whose position is settable via the actuator unit, provide the PWM signal having a current duty ratio; and
    ii) depending on the current duty ratio, select the defined clock frequency of the PWM signal from the plurality of defined clock frequencies.

4. The control device of claim 1, further comprising an assignment unit configured to assign a defined clock frequency from the plurality of defined clock frequencies to each duty ratio that is settable for the PWM signal.

5. The control device of claim 4, wherein the modulator unit is configured, depending on the position to be set of the optical element, to determine a defined duty ratio, to determine the defined clock frequency assigned to the determined duty ratio in the assignment unit, and to provide the PWM signal having the determined duty ratio and the determined defined clock frequency.

6. The control device of claim 1, further comprising an assignment unit configured to:
    i) subdivide duty ratios that are settable for the PWM signal into a plurality of intervals; and ii) assign a defined clock frequency from the plurality of defined clock frequencies to each interval.

7. The control device of claim 6, wherein the modulator unit is configured, depending on the position to be set of the optical element, to determine a defined duty ratio, to determine the defined clock frequency assigned to the determined duty ratio in the assignment unit, and to provide the PWM signal having the determined duty ratio and the determined defined clock frequency.

8. The control device of claim 1, wherein:
the control device is configured so that factors $n1, n2, \ldots, nk$ generate different clock frequencies $f1, f2, \ldots, fk$;
$fk=f0 \cdot nk$ form an uninterrupted sequence of natural numbers; and
$n1=1$.

9. The control device of claim 1, wherein the basic clock frequency is a clock frequency derived from a system clock frequency.

10. The control device of claim 1, wherein a defined clock frequency is assigned to a respective duty ratio depending on a power loss, a current signal and/or a voltage signal of the control device.

11. The control device of claim 10, wherein a defined clock frequency is assigned to a respective duty ratio depending on a system parameter of a lithography apparatus in which the actuator unit is to be used to set a position of an optical unit.

12. The control device of claim 1, wherein a defined clock frequency is assigned to a respective duty ratio depending on a system parameter of a lithography apparatus in which the actuator unit is to be used to set a position of an optical unit.

13. The control device of claim 1, wherein each defined clock frequency of the plurality of defined clock frequencies is defined depending on at least one system parameter.

14. The control device of claim 1, wherein:
a power loss of the amplifier unit for each duty ratio is less than 60% of a maximum power loss of the amplifier unit for a clock frequency that is high in comparison with the basic clock frequency; and
an amplitude of a superposed AC current in a supply line to the amplifier unit and an amplitude of a superposed AC voltage at an output of the amplifier unit for each duty ratio is in each case less than 25% of a maxi-mum amplitude of the superposed AC current and the super-posed AC voltage for the basic clock frequency.

15. The control device of claim 1, wherein the control device is a switching amplifier.

16. An apparatus, comprising:
an optical element;
an actuator unit; and
a control device configured to actuate the actuator unit to set a position of the optical element, the control device comprising:
a modulator unit configured to provide a PWM signal having a duty ratio and a defined clock frequency from a plurality of defined clock frequencies; and
an amplifier unit configured to provide a control signal to the actuator unit via a voltage signal and the PWM signal,
wherein:
the defined clock frequency is an integer multiple of a basic clock frequency, the basic clock frequency is in the range of 10 kHz to 1 MHz;
the amplifier unit is configured to provide, without interruption, the control signal to the actuator unit:
i) in a first time interval via a first PWM signal having a first defined clock frequency from the plurality of defined clock frequencies; and
ii) in a second time interval, directly following the first time interval, via a second PWM signal having a second defined clock frequency from the plurality of defined clock frequencies, the second defined clock frequency being different from the first defined clock frequency; and
the apparatus comprises a lithography apparatus.

17. The apparatus of claim 14, wherein the apparatus comprises an EUV lithography apparatus.

18. The apparatus of claim 17, wherein the optical element comprises a mirror.

19. A method for operating a control device of a lithography apparatus comprising an optical element whose position is settable via an actuator unit, the lithography apparatus further comprising a control device for actuating the actuator unit, the method comprising:
determining a duty ratio of a PWM signal depending on a position of the optical element which is to be set;
determining a defined clock frequency from a plurality of defined clock frequencies depending on the determined duty ratio, a respective defined clock frequency of the plurality of defined clock frequencies being an integer multiple of a basic clock frequency, the basic clock frequency being in the range of 10 kHz to 1 MHz;
providing the PWM signal having the determined duty ratio and the determined clock frequency; and
amplifying the PWM signal with the voltage signal for providing the control signal for setting the position of the optical element.

20. The apparatus of claim 16, wherein the modulator unit is configured to:
i) depending on a position to be set of an optical element whose position is settable via the actuator unit, provide the PWM signal having a current duty ratio; and
ii) depending on the current duty ratio, select the defined clock frequency of the PWM signal from the plurality of defined clock frequencies.

\* \* \* \* \*

UNITED STATES PATENT AND TRADEMARK OFFICE
CERTIFICATE OF CORRECTION

PATENT NO. : 10,983,443 B2
APPLICATION NO. : 16/447622
DATED : April 20, 2021
INVENTOR(S) : Krone et al.

Page 1 of 1

It is certified that error appears in the above-identified patent and that said Letters Patent is hereby corrected as shown below:

In the Claims

Column 19, Line 44, Claim 14, delete "maxi-mum" and insert -- maximum --;

Column 20, Line 23, Claim 17, delete "claim 14" and insert -- claim 16 --.

Signed and Sealed this
Twenty-ninth Day of June, 2021

Drew Hirshfeld
*Performing the Functions and Duties of the
Under Secretary of Commerce for Intellectual Property and
Director of the United States Patent and Trademark Office*